(12) United States Patent
Mendenhall

(10) Patent No.: US 7,948,281 B2
(45) Date of Patent: May 24, 2011

(54) METHOD AND APPARATUS FOR PRODUCING TRIANGULAR WAVEFORM WITH LOW AUDIO BAND NOISE CONTENT

(75) Inventor: Eric Mendenhall, Dove Canyon, CA (US)

(73) Assignee: RGB Systems, Inc., Anaheim, CA (US)

( * ) Notice: Subject to any disclaimer, the term of this patent is extended or adjusted under 35 U.S.C. 154(b) by 0 days.

(21) Appl. No.: 12/019,264

(22) Filed: Jan. 24, 2008

(65) Prior Publication Data

US 2008/0180141 A1     Jul. 31, 2008

Related U.S. Application Data

(60) Provisional application No. 60/886,643, filed on Jan. 25, 2007.

(51) Int. Cl.
*H03K 4/06* (2006.01)
(52) U.S. Cl. ........................................ 327/131; 327/132
(58) Field of Classification Search ........... 327/131–140
See application file for complete search history.

(56) References Cited

U.S. PATENT DOCUMENTS

| | | | |
|---|---|---|---|
| 3,633,043 A | | 1/1972 | Anthony |
| 4,335,444 A | * | 6/1982 | Blaschke ............... 708/809 |
| 7,116,164 B1 | | 10/2006 | Aram |
| 7,183,818 B2 | * | 2/2007 | Tsuji ...................... 327/132 |
| 2004/0195918 A1 | | 10/2004 | Midya et al. |
| 2005/0242878 A1 | | 11/2005 | Mendenhall |
| 2006/0001461 A1 | * | 1/2006 | Tsuji ...................... 327/131 |
| 2006/0072658 A1 | * | 4/2006 | Yasuda et al. ......... 375/238 |
| 2006/0181346 A1 | * | 8/2006 | Nguyen ................. 330/251 |

\* cited by examiner

*Primary Examiner* — Lincoln Donovan
*Assistant Examiner* — Diana J Cheng
(74) *Attorney, Agent, or Firm* — The Hecker Law Group, PLC

(57) ABSTRACT

A triangular waveform generator includes a square waveform clock circuit and an active integrator. The active integrator receives input from the square waveform clock circuit and generates a triangular waveform output. An active feedback network is operatively added to the active integrator to reduce the audio band noise content in the triangular waveform output. The feedback network acts as a DC balance without significant sacrifice in the linearity of the triangular waveform output.

12 Claims, 5 Drawing Sheets

US 7,948,281 B2

METHOD AND APPARATUS FOR PRODUCING TRIANGULAR WAVEFORM WITH LOW AUDIO BAND NOISE CONTENT

CROSS-REFERENCE TO RELATED APPLICATIONS

This application claims the benefit of U.S. provisional patent application Ser. No. 60/886,643, filed on Jan. 25, 2007, the disclosure of which is incorporated in its entirety by reference herein.

FIELD OF THE INVENTION

The present invention relates to class D amplifier circuits. More particularly, the invention relates to apparatus and method for producing triangular waveform with low audio band noise content.

BACKGROUND

A Class D audio amplifier is an electronic amplifier in which the active devices in the output stage are operated in on/off mode, i.e. as switches. The audio input signal is converted to a sequence of pulses whose average value is directly proportional to the amplitude of the signal. These types of amplifiers may use PWM (Pulse Width Modulation), pulse frequency modulation or sigma delta modulation. The frequency of the pulses is preferably much higher than the highest frequency of interest in the input signal. The switching output includes pulse trains whose width is a function of the amplitude and frequency of the signal being amplified. The output, however, typically contains undesirable spectral components (the pulse frequency and its harmonics) that may lead to distortion.

A typical Class D audio amplifier generates a PWM output signal by feeding a comparator 10 (FIG. 1) with an analog audio input 12 (FIG. 1) and an oscillator ramp input 14 from a triangular wave generator (not shown). Audio band noise present in the triangle wave is reproduced in the square waveform PWM output signal 16 (FIG. 1). Conventional negative feedback techniques attempt to reduce the noise introduced in this stage. However, the loop gain of a class D amplifier is typically low at the high end of the audio bandwidth, thereby limiting the effectiveness of these techniques. The present invention overcomes the disadvantages of the prior art by reducing audio noise that is present on oscillator ramp input 14 (FIG. 1) instead.

SUMMARY OF THE INVENTION

Some embodiments disclosed herein are generally directed to an apparatus and method for generating triangular waveform with low audio band noise content for use in Class D amplifier circuits and for other applications.

In one or more embodiments of the present invention, a triangular waveform generating apparatus includes a square waveform clock circuit and an active integrator. The active integrator receives input from the square waveform clock circuit and generates a triangular waveform output. An active feedback network is operatively added to the active integrator to reduce the audio band noise content in the triangular waveform output. The feedback network acts as a DC balance without significant sacrifice in the linearity of the triangular waveform output.

In one or more embodiments, the triangular waveform generating method of the invention includes the steps of:

(a) utilizing a square waveform clock circuit;
(b) providing an active integrator which receives input from the square waveform clock circuit;
(c) configuring the active integrator to generate a triangular waveform output;
(d) operatively coupling an active feedback network to the active integrator; and
(e) adapting the operatively coupled active feedback network to help reduce the audio band noise content in the triangular waveform output.

These and other aspects of the invention will become apparent from a review of the accompanying drawings and the following detailed description of the invention.

DETAILED DESCRIPTION OF THE INVENTION

The detailed description set forth below in connection with the appended drawings is intended as a description of illustrated exemplary embodiments and is not intended to represent the only forms in which these embodiments may be constructed and/or utilized. The description sets forth the functions and sequence of steps for constructing and operating the present invention in connection with the illustrated embodiments. However, it is to be understood that the same or equivalent functions and/or sequences may be accomplished by different embodiments that are also intended to be encompassed within the spirit and scope of the present invention.

Some embodiments of the present invention will be described in detail with reference to an apparatus and method for producing triangular waveform with low audio band noise content, as generally depicted in reference to FIGS. 5-7. Additional embodiments, features and/or advantages of the invention will become apparent from the ensuing description or may be learned by practicing the invention. In the attached figures, the various drawings are not to scale with like numerals referring to like features throughout both the drawings and the description.

Figure 1:
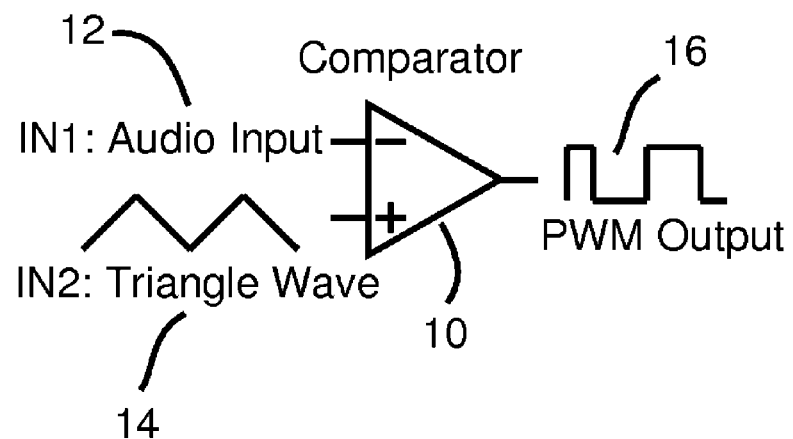
FIG. 1 is a schematic illustration of a typical Class D amplifier design of the prior art.
Figure 2:
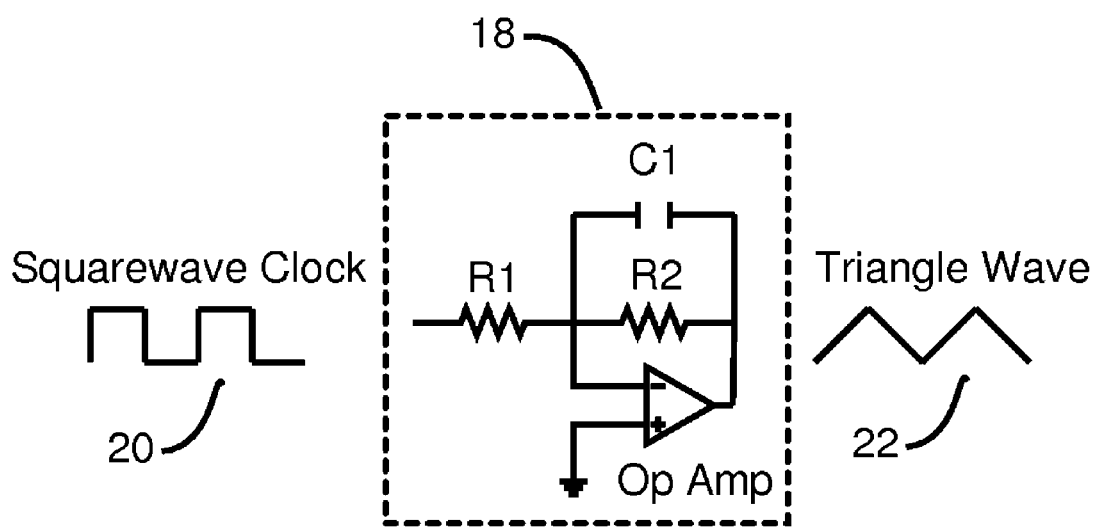
FIG. 2 is a schematic illustration of a conventional triangular waveform generator of the prior art.

FIG. 2 shows a conventional triangular waveform generator 18 with limited DC gain which receives input from a square wave clock 20 and outputs a triangular waveform 22. A person skilled in the art would readily appreciate that one disadvantage of triangular waveform generator 18 is that the DC gain limit must be low enough to provide acceptable DC offset of triangular waveform output 22. This, however, compromises the linearity of the triangle wave produced by triangular waveform generator 18, as generally depicted in reference to FIG. 3. Another disadvantage of using this type of design is the high gain in the audio bandwidth which causes any noise present on square wave clock 20 to be amplified, as shown in the Bode plot of FIG. 4.

Figure 5:
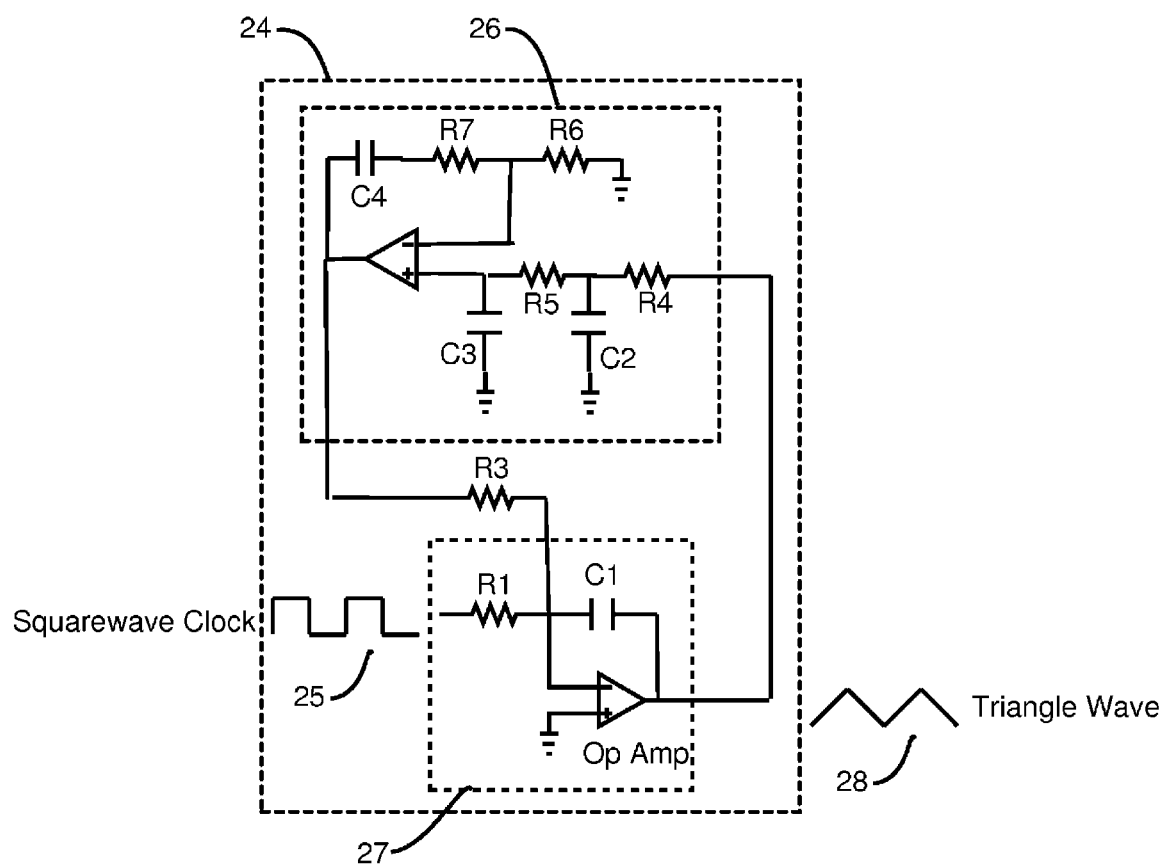
FIG. 5 is a schematic illustration of a triangular waveform generator constructed in accordance with an embodiment of the present invention.

FIG. 5 schematically illustrates a triangular waveform generator 24 constructed in accordance with an embodiment of the present invention. Particularly, triangular waveform generator 24 incorporates an active feedback network 26 (FIG. 5) to advantageously produce a triangular waveform output 28 (FIG. 5) with low audio band noise. Triangular waveform generator 24 receives input from a square wave clock 25 (FIG. 5) which introduces noise into the system. Triangular waveform generator 24 also includes an active integrator 27 which is operatively coupled to feedback network 26.

Figure 3:
FIG. 3 is a graphical representation of the output signal produced by the triangular waveform generator of FIG. 2.
Figure 4:
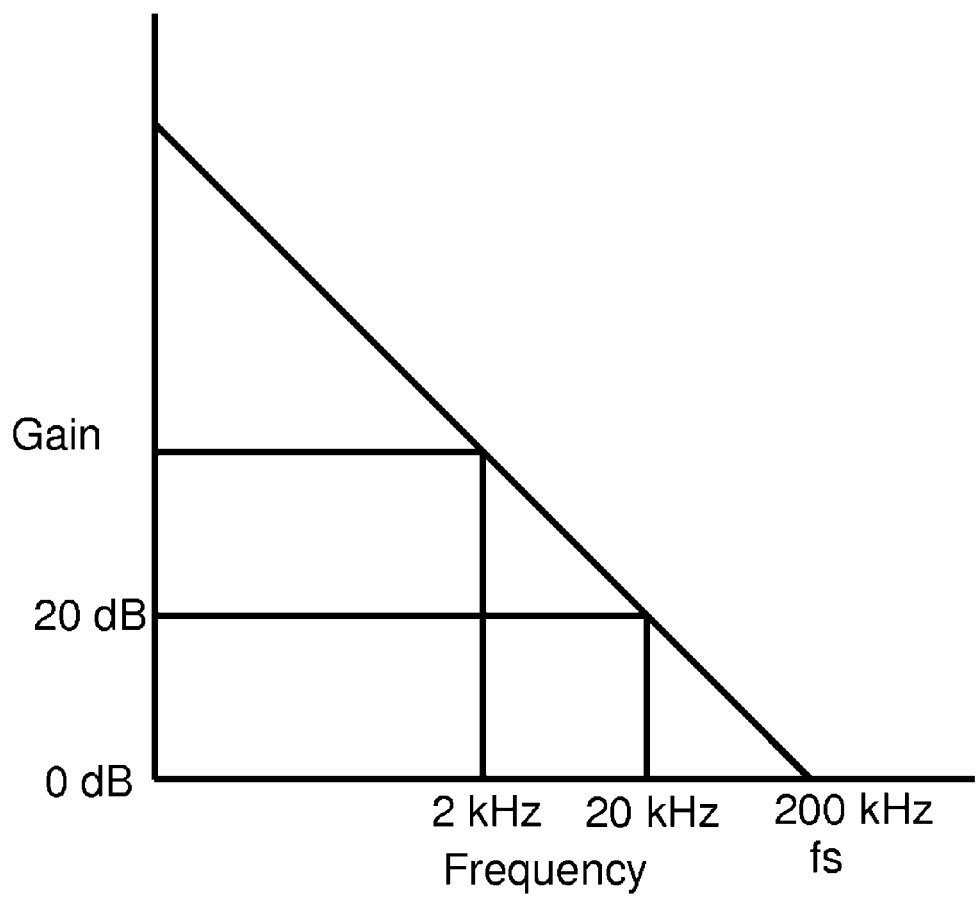
FIG. 4 depicts a Bode magnitude plot of the active integrator gain of the triangular waveform generator of FIG. 2.

Active feedback network 26 (FIG. 5) is configured to have high gain at audio frequencies and low gain at the switching frequency to avoid the output nonlinearity of FIG. 3. The feedback signal includes a region of nearly flat gain in order to satisfy system stability needs. A Bode plot showing the forward gain and the feedback gain, respectively is depicted in FIG. 7.

Figure 6:
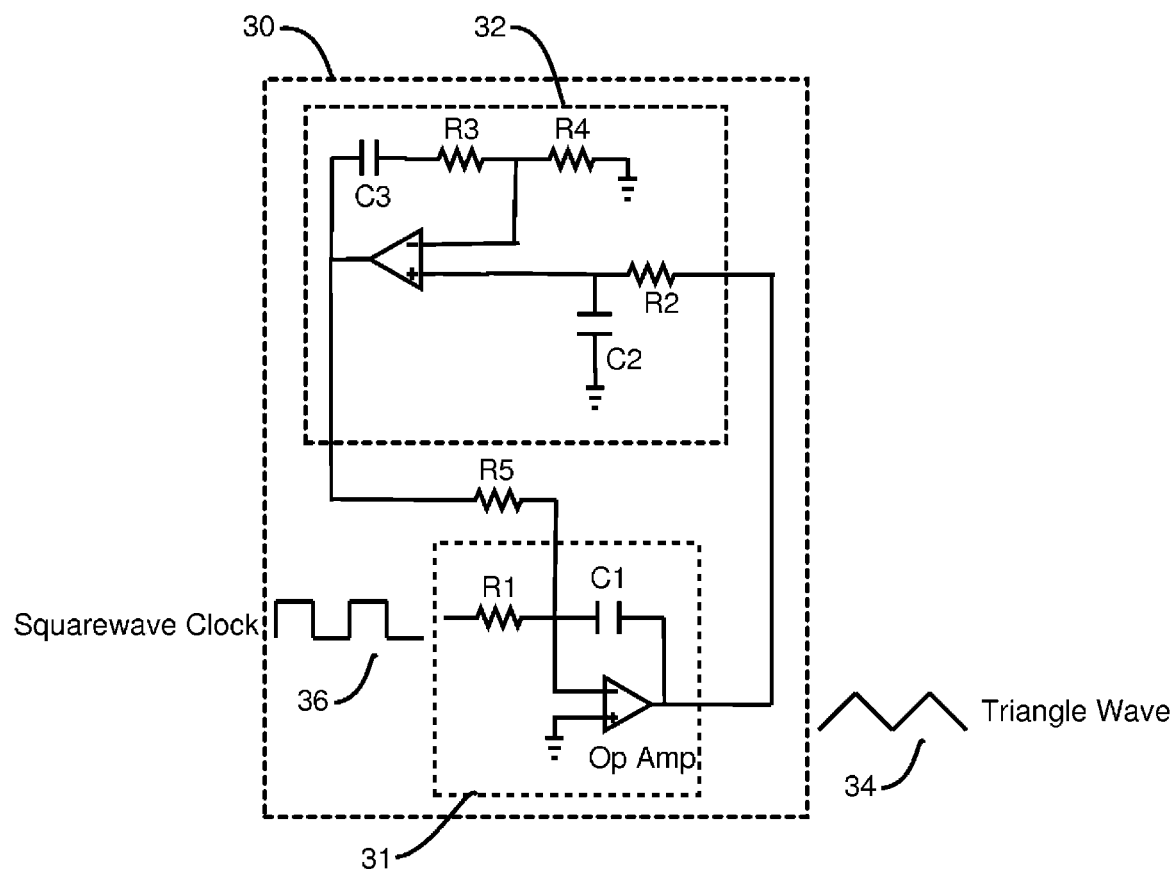
FIG. 6 is a schematic illustration of a triangular waveform generator constructed in accordance with an alternative embodiment of the present invention.
Figure 7:
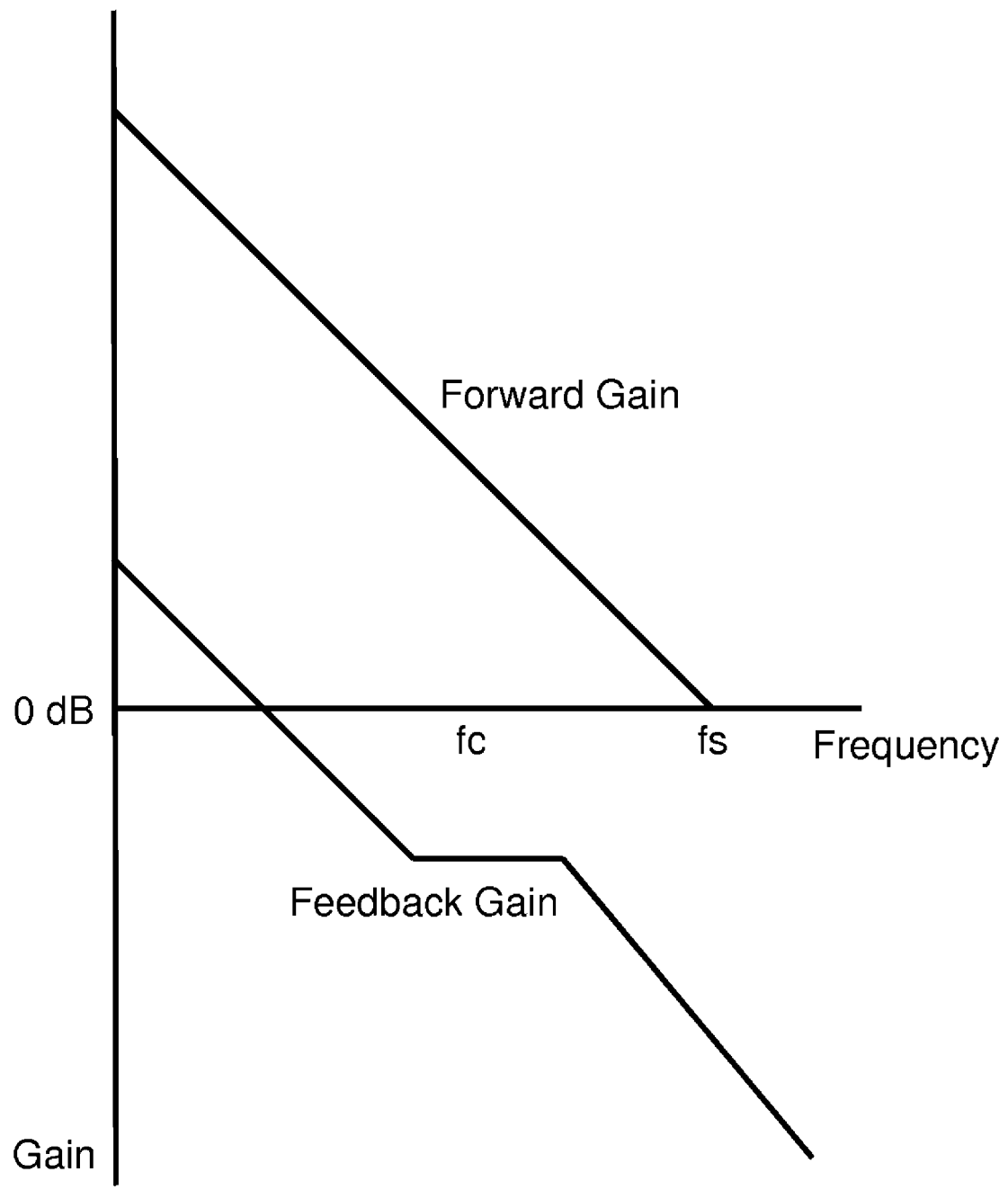
FIG. 7 is a Bode magnitude plot of the active integrator gain of the triangular waveform generator of FIG. 5.

FIG. 6 schematically illustrates a triangular waveform generator 30 constructed in accordance with an alternative embodiment of the present invention. Particularly, triangular waveform generator 30 incorporates an active feedback network 32 (FIG. 6) which helps reduce the audio band noise in triangular waveform output 34 (FIG. 6). Triangular waveform generator 30 receives input from a square wave clock 36 (FIG. 6) which introduces noise into the system. Triangular waveform generator 30 also includes an active integrator 31 which is operatively coupled to feedback network 32.

Active feedback network 32 is configured to have high gain at audio frequencies and low gain at the switching frequency to avoid the output nonlinearity of FIG. 3. The feedback signal has a region of nearly flat gain to satisfy system stability needs.

A person skilled in the art will appreciate that the addition of an active feedback network (such as the one shown in reference to FIG. 5 or FIG. 6) with one or more poles below the crossover frequency and one or more poles above the crossover frequency to a triangular waveform generator results in substantial reduction of the audio band noise of the output signal. This in turn reduces the audio band noise of the pulse width modulator and therefore the audio band noise of the entire Class D amplifier.

A person skilled in the art would also appreciate that the incorporation of an active feedback network in accordance with the general principles of the present invention carries the added benefit of acting as a DC (Direct Current) balance without significant sacrifice in triangular waveform output linearity.

The low-audio triangular waveform generator of the present invention is suited for use as the comparator input of a Class D amplifier, as well as for other applications where a low-audio noise triangular waveform is desired.

The exemplary embodiments described hereinabove are merely illustrative of the general principles of the present invention. Various design modifications may be employed that would reside within the scope of the invention. For example, a person skilled in the art would appreciate that the triangular waveform generator of the present invention may be implemented by various other configurations with off-the-shelf components. Thus, by way of example, but not of limitation, various alternative configurations may be utilized in accordance with the teachings herein. Accordingly, the drawings and description are illustrative and not meant to be a limitation thereof. Thus, it is intended that the invention cover all embodiments and variations thereof as long as such embodiments and variations come within the scope of the appended claims and their equivalents.

What is claimed is:

1. An electrical circuit for generating a single frequency triangular waveform with low audio band noise content:
    a square waveform generator configured to generate a single frequency square waveform having a pulse frequency higher than audio frequencies;
    an active integrator having an input and an output, said input receiving said square waveform from said square waveform generator, said active integrator configured to generate a single frequency triangular waveform at said output of said active integrator;
    an active feedback network exhibiting high gain at audio frequencies and low gain at said pulse frequency having an input coupled to said output of said active integrator and an output coupled to said input of said active integrator, said active feedback network reducing audio band noise in said triangular waveform output.

2. The electronic circuit of claim 1 further comprising a comparator that receives said triangular waveform output and an audio input signal.

3. The electronic circuit of claim 2 wherein said comparator provides an output signal comprising pulses based on an amplitude and frequency of said audio input signal.

4. The electronic circuit of claim 1 wherein said active feedback network has at least one pole below a crossover frequency.

5. The electronic circuit of claim 1 wherein said active feedback network has at least one pole above a crossover frequency.

6. The electronic circuit of claim 4 wherein said active feedback network has at least one pole above said crossover frequency.

7. A method for generating a single frequency triangular waveform with low audio band noise content, said method comprising the steps of:
    generating a single frequency square waveform having a pulse frequency higher than audio frequencies;
    integrating said square waveform to produce a single frequency triangular waveform;
    generating a feedback signal from said triangular waveform;
    modifying said feedback signal by applying a transfer function having a high gain at audio frequencies and a low gain at said pulse frequency;
    combining said modified feedback signal with said square waveform prior to said step of integrating said square waveform to reduce audio band noise in said triangular waveform.

8. The method of claim 7 further comprising the step of comparing said triangular waveform to an audio input signal.

9. The method of claim 8 further comprising the step of generating an output signal comprising pulses based on an amplitude and frequency of said audio input signal.

10. The method of claim 7 wherein said transfer function has at least one pole below a crossover frequency.

11. The method of claim 10 wherein said transfer function has at least one pole above said crossover frequency.

12. The method of claim 7 wherein said transfer function has at least one pole above a crossover frequency.

* * * * *